United States Patent
Kang et al.

(10) Patent No.: US 11,903,119 B2
(45) Date of Patent: Feb. 13, 2024

(54) FLEXIBLE CIRCUIT BOARD AND CHIP PACKAGE HAVING A CHIP MOUNTING REGION

(71) Applicant: LG INNOTEK CO., LTD., Seoul (KR)

(72) Inventors: Chae Won Kang, Seoul (KR); Jun Young Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 240 days.

(21) Appl. No.: 17/384,892

(22) Filed: Jul. 26, 2021

(65) Prior Publication Data

US 2022/0046785 A1 Feb. 10, 2022

(30) Foreign Application Priority Data

Aug. 4, 2020 (KR) .................. 10-2020-0097337

(51) Int. Cl.
*H05K 1/02* (2006.01)
*H01L 23/00* (2006.01)
(Continued)

(52) U.S. Cl.
CPC ....... *H05K 1/0206* (2013.01); *H01L 23/4985* (2013.01); *H01L 23/49838* (2013.01);
(Continued)

(58) Field of Classification Search
CPC .... H05K 1/0206; H05K 1/189; H05K 1/0209; H05K 2201/0338; H05K 2201/09736; H05K 1/0201; H05K 2201/05; H05K 1/14; H01L 23/49838; H01L 23/4985; H01L 24/17; H01L 24/16; H01L 2224/16225; H01L 2224/17519; H01L 23/3677; H01L 23/3735; H01L 23/367; H01L 23/3733; H01L 23/3672
(Continued)

(56) References Cited

U.S. PATENT DOCUMENTS 7,915,727 B2 3/2011 Choi et al.
2007/0045804 A1* 3/2007 Lin ..................... H01L 23/3677
257/E23.105
(Continued)

FOREIGN PATENT DOCUMENTS

JP 2009170601 A * 7/2009
KR 10-2009-0110206 10/2009
(Continued)

*Primary Examiner* — Nduka E Ojeh
*Assistant Examiner* — Laura M Dykes
(74) *Attorney, Agent, or Firm* — KED & Associates LLP

(57) ABSTRACT

A flexible circuit board for a chip on film according to an embodiment includes: a substrate including a first surface and a second surface opposite to the first surface and including a chip mounting region; a circuit pattern layer disposed on the first surface; and a heat dissipation part disposed in the chip mounting region, wherein the substrate is formed with at least two or more holes that are formed in a region overlapping the heat dissipation part, and the heat dissipation part includes: a heat dissipation pattern layer disposed on the first surface; a connection layer disposed inside the hole; and a heat dissipation layer disposed on the second surface.

16 Claims, 8 Drawing Sheets

(51) Int. Cl.
*H01L 23/498* (2006.01)
*H05K 1/18* (2006.01)

(52) U.S. Cl.
CPC ............. *H01L 24/17* (2013.01); *H05K 1/189* (2013.01); *H01L 24/16* (2013.01); *H01L 2224/16225* (2013.01); *H01L 2224/17519* (2013.01)

(58) Field of Classification Search
USPC ........................................................ 257/734
See application file for complete search history.

(56) References Cited

U.S. PATENT DOCUMENTS

2019/0378777 A1\* 12/2019 Liao .................. H01L 23/50
2020/0221571 A1\* 7/2020 Lee .................. H05K 1/184

FOREIGN PATENT DOCUMENTS

| KR | 101166069 B1 | \* | 7/2012 |
| KR | 10-1273526 | | 6/2013 |
| KR | 10-2013-0092808 A | \* | 8/2013 |

\* cited by examiner

[FIG. 1]
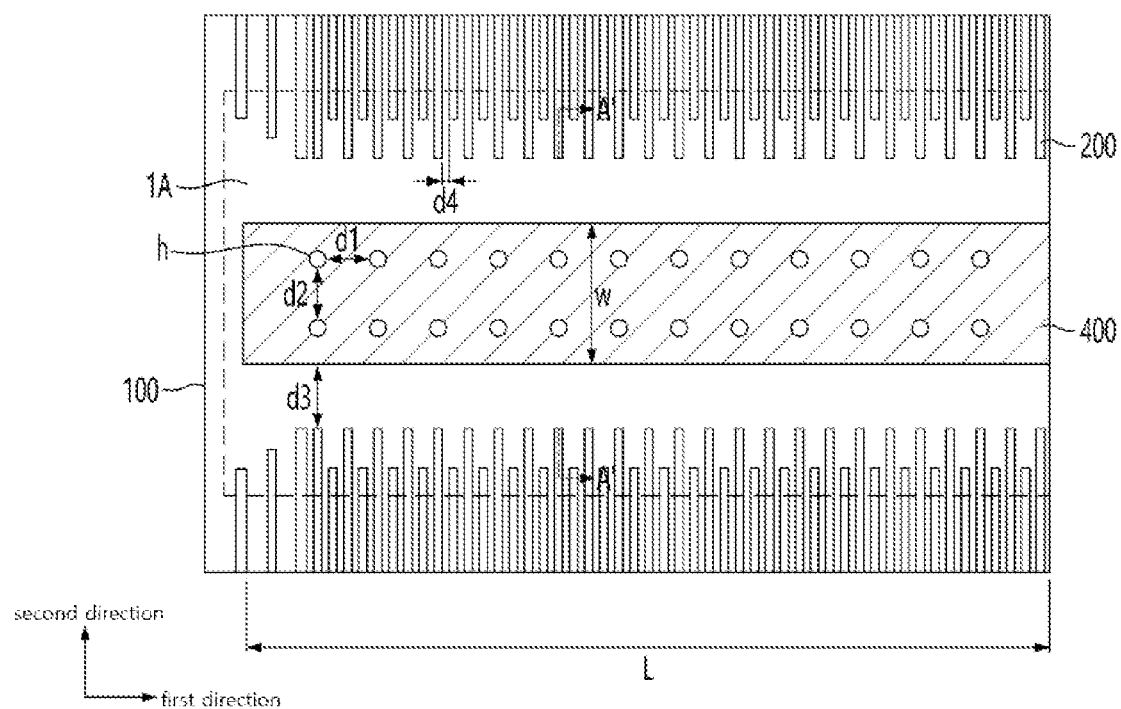

【FIG. 2】
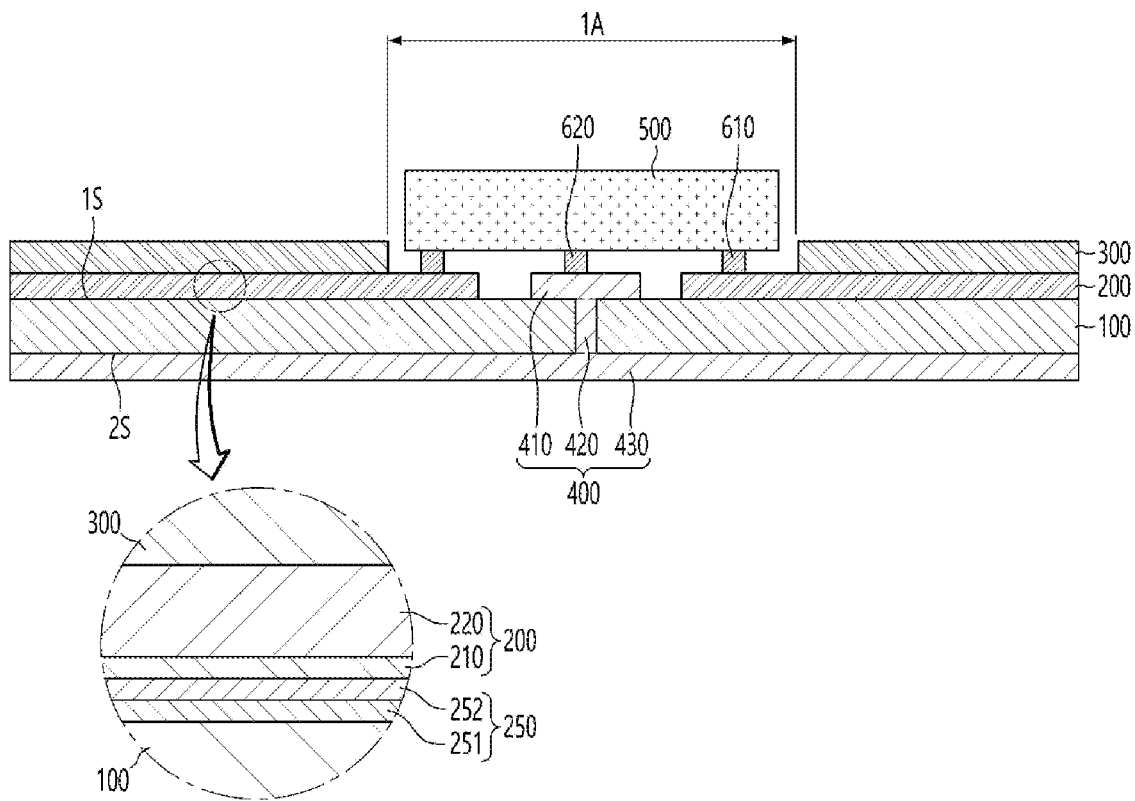
【FIG. 3】
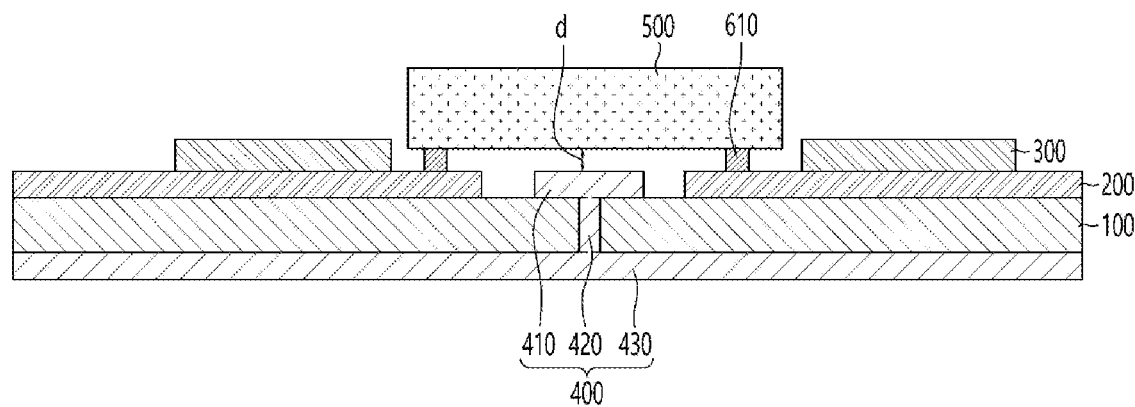

【FIG. 4】
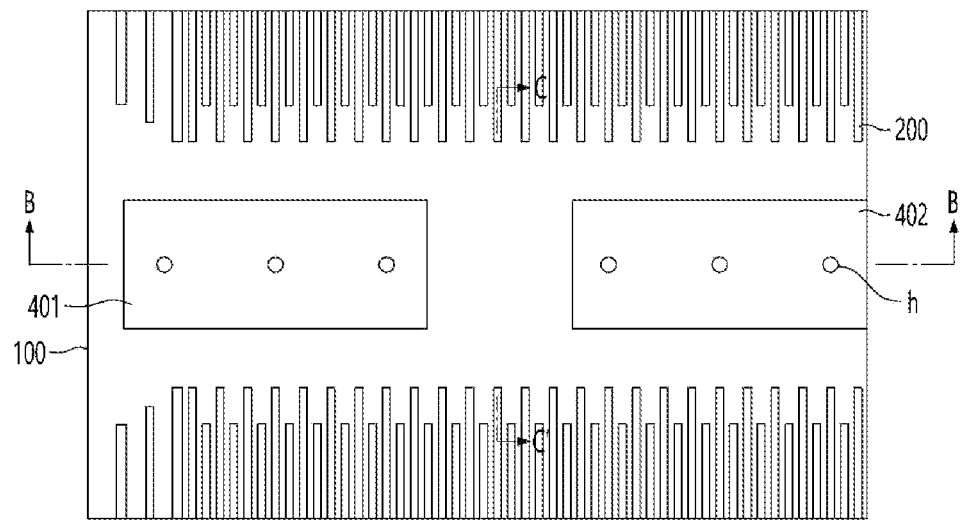
【FIG. 5】
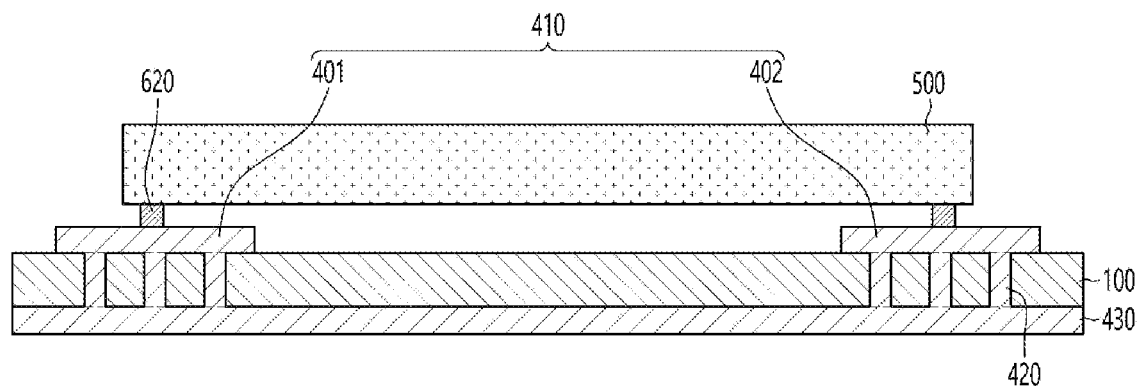
【FIG. 6】
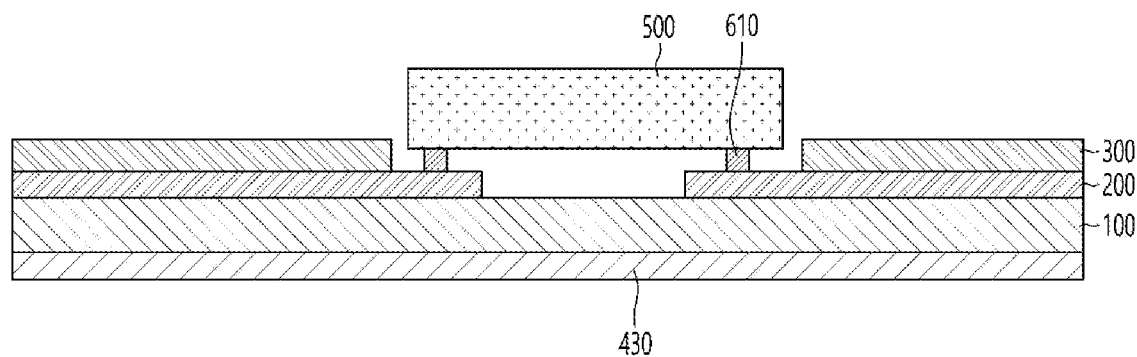

[FIG. 7]
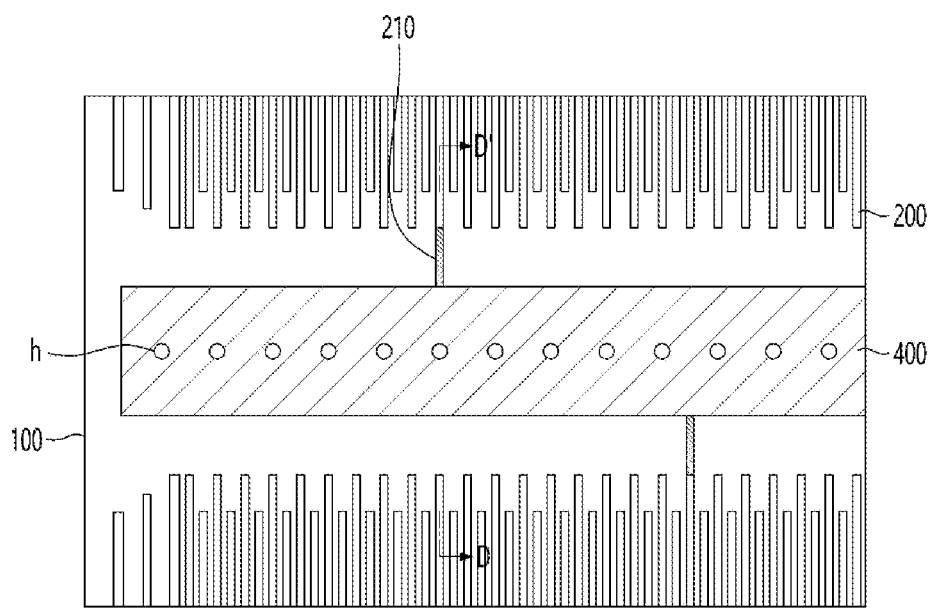
[FIG. 8]
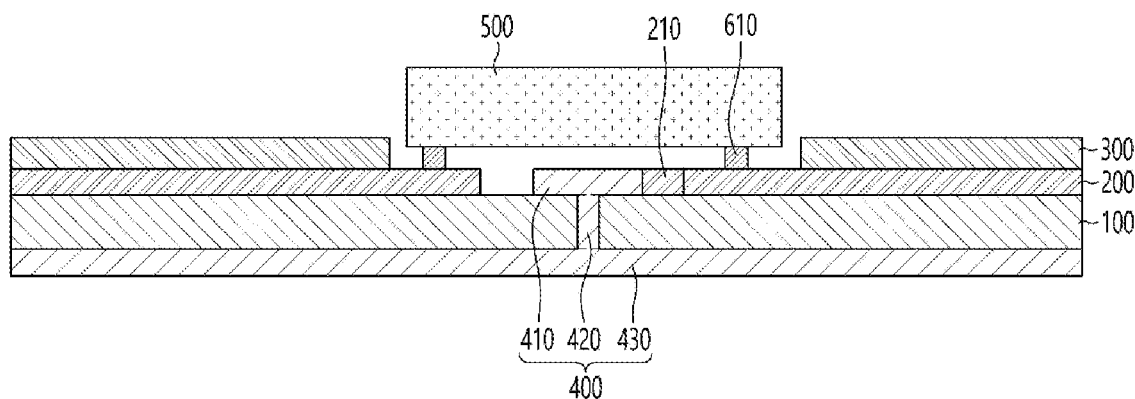

【FIG. 9】
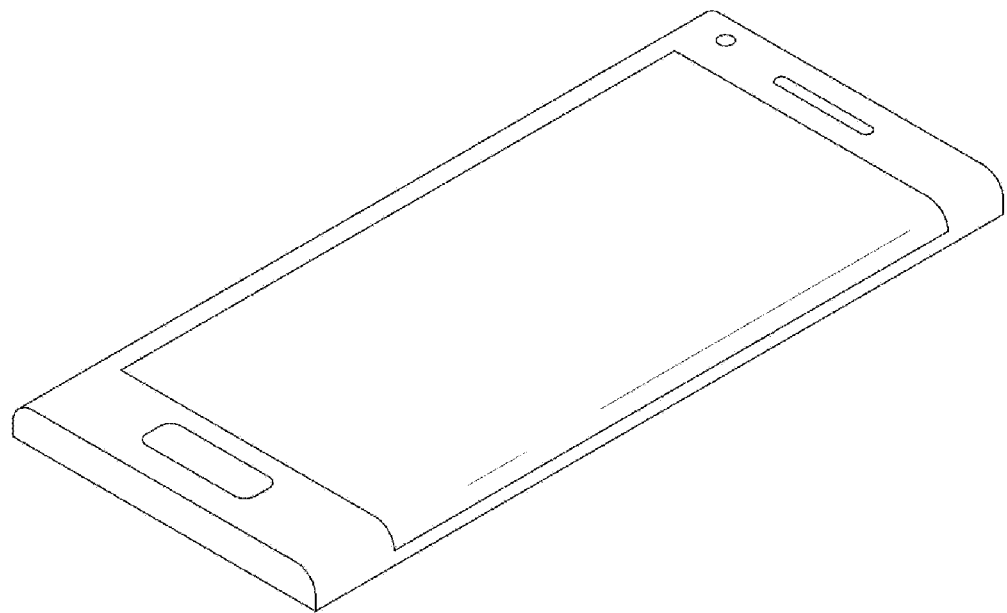
【FIG. 10】
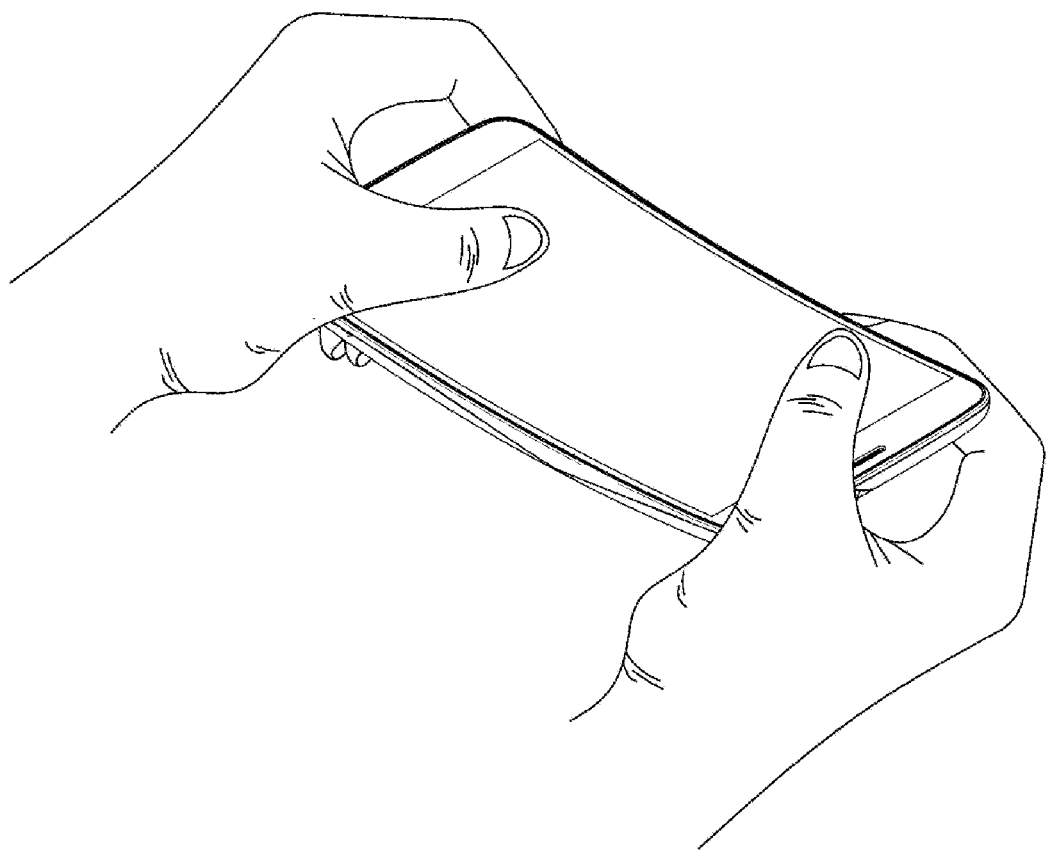

【FIG. 11】
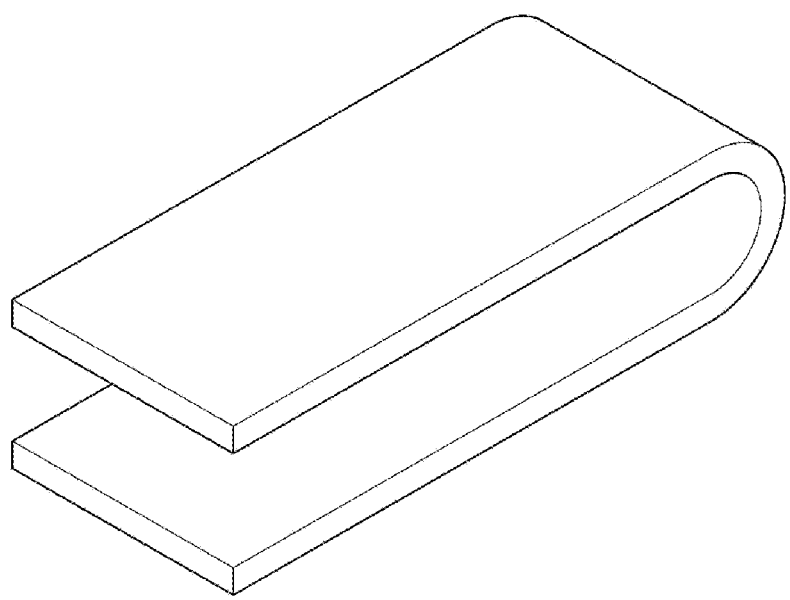
【FIG. 12】
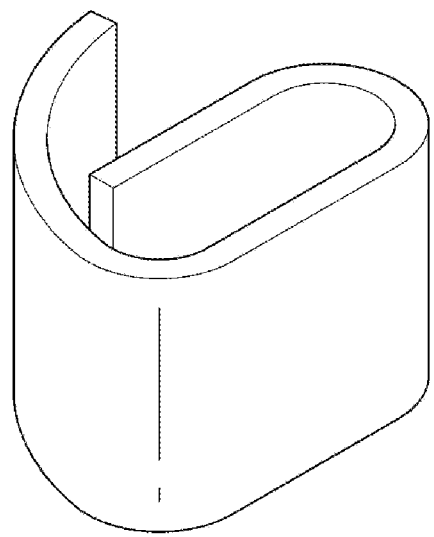

【FIG. 13】
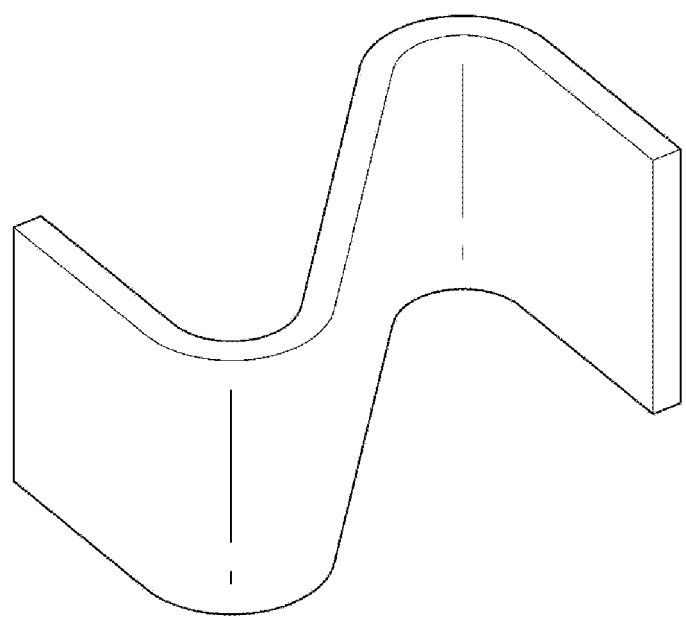
【FIG. 14】
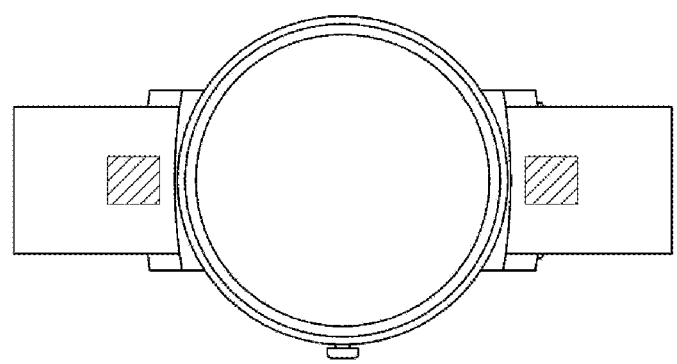

[FIG. 15]
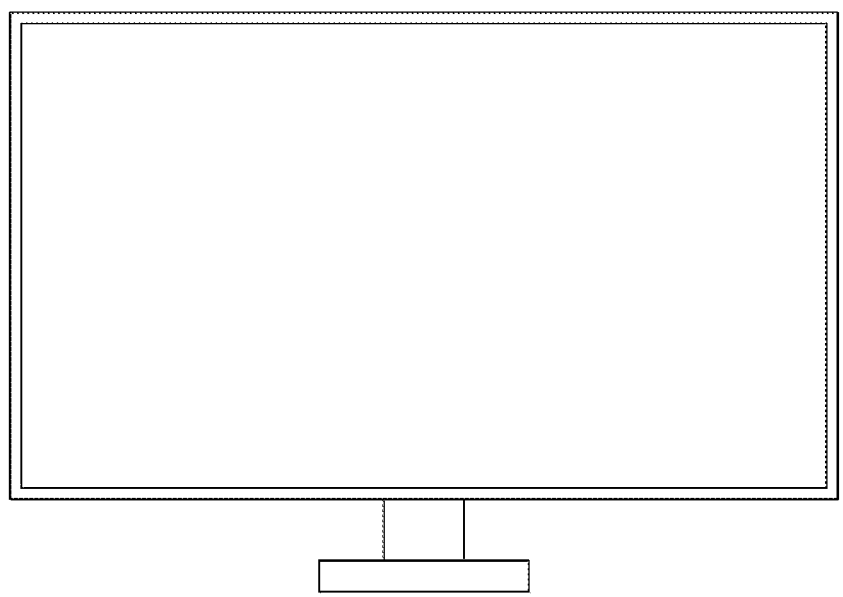

FLEXIBLE CIRCUIT BOARD AND CHIP PACKAGE HAVING A CHIP MOUNTING REGION

CROSS-REFERENCE TO RELATED APPLICATIONS

This application claims priority under 35 U.S.C. 119 and 35 U.S.C. 365 to Korean Patent Application No. 10-2020-0097337 (filed on 4 Aug. 2020), which is hereby incorporated by reference in its entirety.

TECHNICAL FIELD

An embodiment provides a flexible circuit board for a chip on film having improved heat dissipation characteristics and a chip package including the same.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible circuit board in the form of a thin film. For example, the semiconductor chip may be an integrated circuit (IC) chip or a large scale integrated circuit (LSI) chip.

Meanwhile, in a chip mounted on the flexible circuit board, heat is generated while the chip is being driven, and such heat may induce a malfunction in the chip and deteriorate reliability of a chip package.

Accordingly, in a chip package including a flexible circuit board for a chip on film, a flexible circuit board for a chip on film having a new structure capable of reducing heat generated by the chip is required.

SUMMARY

Technical Problem

An embodiment provides a flexible circuit board for chip on film having improved heat dissipation characteristics and a chip package including the same.

Technical Solution

A flexible circuit board for a chip on film according to an embodiment includes: a substrate including a first surface and a second surface opposite to the first surface and including a chip mounting region; a circuit pattern layer disposed on the first surface; and a heat dissipation part disposed in the chip mounting region, wherein the substrate is formed with at least two or more holes that are formed in a region overlapping the heat dissipation part, and the heat dissipation part includes: a heat dissipation pattern layer disposed on the first surface; a connection layer disposed inside the hole; and a heat dissipation layer disposed on the second surface.

Advantageous Effects

A flexible substrate for a chip on film according to an embodiment can effectively dissipate heat generated in a chip to the outside via a hole formed in a substrate and a heat dissipation part disposed on a first surface, on a second surface, and inside the hole of the substrate.

That is, the heat generated from the chip can be collected via the heat dissipation pattern layer, and the heat can be transferred to the heat dissipation layer via connection parts disposed in a plurality of holes to dissipate the heat to the outside.

In addition, the heat may be effectively transferred to the heat dissipation layer by forming a hole to which the heat is transferred in plural, and the heat dissipation layer is formed to have an area corresponding to the chip mounting region, thereby easily dissipating the heat generated from the chip to the outside.

Accordingly, since the flexible substrate for the chip on film and the chip package including the same according to the embodiment have improved heat dissipation characteristics, reliability and driving characteristics of the chip package may be improved.

BRIEF DESCRIPTION OF THE DRAWINGS

FIG. 1 is a view showing a top view of a region of a flexible circuit board according to an embodiment.

FIGS. 2 and 3 are views showing a cross-sectional view taken along line A-A' of FIG. 1.

FIG. 4 is a view showing a top view of a region of a flexible circuit board according to another embodiment.

FIG. 5 is a view showing a cross-sectional view taken along line B-B' of FIG. 4.

FIG. 6 is a view showing a cross-sectional view taken along line C-C' of FIG. 4.

FIG. 7 is a view showing a top view of a region of a flexible circuit board according to still another embodiment.

FIG. 8 is a view showing a cross-sectional view taken along line D-D' of FIG. 7.

FIGS. 9 to 15 are views of various electronic devices including a flexible circuit board according to an embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced. In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible substrate for a chip on film according to an embodiment will be described with reference to the drawings.

FIG. 1 is a view showing a top view of a region of a flexible circuit board according to an embodiment, and FIGS. 2 and 3 are views showing a cross-sectional view taken along line A-A' of FIG. 1.

Referring to FIGS. 1 to 3, the flexible substrate for the chip on film according to the embodiment may include a substrate 100, a circuit pattern layer 200 disposed on the substrate 100, a protective layer 300, and a heat dissipation part 400.

The substrate 100 may support the circuit pattern layer 200, the protective layer 300, and the heat dissipation part 400.

The substrate 100 may include a first surface 1S and a second surface 2S opposite to the first surface 1S. The first surface 1S of the substrate 100 may support the circuit pattern layer 200 and the protective layer 300. In addition, the heat dissipation part 400 may be disposed on the first surface 1S and the second surface 2S of the substrate 100.

That is, the circuit pattern layer 200, the protective layer 300, and the heat dissipation unit 400 may be disposed on opposite surfaces of the substrate 100, respectively, The substrate 100 may include a chip mounting region 1A. In detail, the protective layer 300 is not disposed on the first surface 1S of the substrate 100, and a chip mounting region 1A that exposes the substrate 100 and the circuit pattern layer 200 may be included.

The substrate 100 may include a bending region and a region other than the bending region. That is, the substrate 100 may include a bending region in which bending is performed and a non-bending region other than the bending region.

The substrate 100 may be a flexible substrate. Accordingly, the substrate 100 may be partially bent. That is, the substrate 100 may include a flexible plastic. For example, the substrate 100 may be a polyimide (PI) substrate. However, the embodiment is not limited thereto, and the substrate 100 may be a substrate made of a polymer material such as polyethylene terephthalate (PET), polyethylene naphthalate (PEN), or the like.

Accordingly, the flexible circuit board including the substrate 100 may be used in various electronic devices having a curved display device. For example, the flexible circuit board including the substrate 100 is excellent in flexible characteristics, thereby having suitability of mounting a semiconductor chip on a wearable electronic device. In particular, the embodiment may be suitable for an electronic device including a curved display.

The substrate 100 may be an insulating substrate. That is, the substrate 100 may be an insulating substrate supporting various wiring patterns.

The substrate 100 may have a thickness of 5 μm to 100 μm. For example, the substrate 100 may have a thickness of 10 μm to 90 ρm. For example, the substrate 100 may have a thickness of 12 μm to 80 μm. When the thickness of the substrate 100 exceeds 100 μm, the overall thickness of the flexible circuit board may be increased. When the thickness of the substrate 100 is less than 5 μm, the substrate 100 may be vulnerable to heat/pressure in a process of mounting a chip.

A plurality of holes h may be formed in the substrate 100. In detail, the hole h may be formed in a region overlapping the chip mounting region 1A. Heat generated from a chip mounted in the chip mounting region 1A via the hole h formed in the substrate 100 may be dissipated to the outside via the heat dissipation part 400 disposed on the second surface 2S of the substrate.

The hole and the heat dissipation part will be described in detail below.

The circuit pattern layer 200 may be disposed on the substrate 100. In detail, the circuit pattern layer 200 may be disposed on the first surface 1S of the substrate 100. The circuit pattern layer 200 may be a plurality of patterned wirings. For example, the plurality of circuit pattern layers 200 may be disposed to be spaced apart from each other on the substrate 100.

The circuit pattern layer 200 may be connected to a chip 500 disposed in the chip mounting region 1A and an external device. Accordingly, communication between the chip 500 and the external device and power supply to the chip 500 may be performed.

An area of the substrate 100 may be larger than that of the circuit pattern layer 200. In detail, a planar area of the substrate 100 may be larger than that of the circuit pattern layer 200. That is, the circuit pattern layer 200 may be partially disposed on the substrate 100. For example, a lower surface of the circuit pattern layer 200 may be in contact with the first surface 1S of the substrate 100, and the substrate 100 may be exposed between the plurality of circuit pattern layers. The circuit pattern layer 200 may include a conductive material.

For example, the circuit pattern layer 200 may include a metal material having excellent electrical conductivity. In more detail, the circuit pattern layer 200 may include copper (Cu). However, the embodiment is not limited thereto, and it is possible to include at least one metal among copper (Cu), aluminum (Al), chromium (Cr), nickel (Ni), silver (Ag), molybdenum (Mo), gold (Au), titanium (Ti), and an alloy thereof.

The circuit pattern layer 200 may be formed in multiple layers. In detail, the circuit pattern layer 200 may include a first metal layer 210 and a second metal layer 220.

The first metal layer 210 may be a seed layer of the circuit pattern layer 200. In detail, the first metal layer 210 may be a seed layer formed on the first surface 1S of the substrate 100 through electroless plating using a metal material such as copper (Cu).

In addition, the second metal layer 220 may be a plating layer. In detail, the second metal layer 220 may be a plating layer formed by electroplating using the first metal layer 210 as a seed layer.

A thickness of the first metal layer 210 may be smaller than a thickness of the second metal layer 220.

For example, the thickness of the first metal layer 210 may be 0.7 μm to 2 μm, and the thickness of the second metal layer 220 may be 10 μm to 25 μm.

The first metal layer 210 and the second metal layer 220 may include the same metal material. For example, the first metal layer 210 and the second metal layer 220 may include copper (Cu).

The circuit pattern layer 200 may be disposed to have a thickness of 5 μm to 25 μm. For example, the circuit pattern layer 200 may be disposed to a thickness of 10 μm to 20 μm. For example, the circuit pattern layer 200 may have a thickness of 13 μm to 17 μm.

Since the circuit pattern layer 200 is subjected to a process of etching the first metal layer 210 by flash etching performed for separation of the circuit pattern layers during a manufacturing process, the circuit pattern layer 200 to be finally manufactured may be smaller than the thickness of the first metal layer 210 and the second metal layer 220.

When a thickness of the circuit pattern layer 200 is less than 5 μm, a resistance of the circuit pattern layer 200 may increase. When the thickness of the circuit pattern layer 200 exceeds 25 μm, it may be difficult to implement a fine pattern.

Meanwhile, a buffer layer 250 may be further disposed between the substrate 100 and the circuit pattern layer 200. The buffer layer 250 may improve adhesion between the substrate 100 and the circuit pattern layer 200 that are a dissimilar material.

The buffer layer 250 may be formed in multiple layers. In detail, a first buffer layer 251 and a second buffer layer 252 on the first buffer layer 251 may be disposed on the substrate 100. Accordingly, the first buffer layer 251 may be in contact with the substrate 100, and the second buffer layer 252 may be disposed in contact with the circuit pattern layer 200.

The first buffer layer 251 may include a material having good adhesion to the substrate 100. For example, the first buffer layer 251 may include nickel (Ni). In addition, the second buffer layer 252 may include a material having good adhesion to the circuit pattern layer 200. For example, the second buffer layer 252 may include chromium (Cr).

Since the adhesion between the substrate 100 and the circuit pattern layer 200 that are a dissimilar material may be improved by the buffer layer 250, it is possible to prevent delamination of a film of the circuit pattern layer 200.

The protective layer 300 may be disposed on the circuit pattern layer 200.

The protective layer 300 may be partially disposed on the circuit pattern layer 200. The protective layer 300 may be disposed while covering the circuit pattern layer 200, and the protective layer 300 may prevent damage or delamination of a film caused by oxidation of the circuit pattern layer 200.

The protective layer 300 may be partially disposed in a region excluding a region in which the circuit pattern layer 200 is electrically connected to the chip 500 and an external device such as a display panel or a main board.

The protective layer 300 may include solder paste. For example, the protective layer 300 may include a solder paste including a thermosetting resin, a thermoplastic resin, a filler, a curing agent, or a curing accelerator.

The chip 500, may be disposed in the chip mounting region 1A of the substrate 100.

The chip 500 may include a semiconductor chip. For example, the chip 500 may include an integrated circuit (IC) chip or a large scale integrated circuit (LSI) chip.

The chip 500 may be disposed on the circuit pattern layer 200 on which the protective layer 300 is not disposed.

In detail, a terminal of the chip 500 may be electrically connected by directly or indirectly in contact with the circuit pattern layer 200.

For example, as shown in FIGS. 2 and 3, a first bump 610 may be disposed between the chip 500 and the circuit pattern layer 200, and the chip 500 and the circuit pattern layer 200 may be electrically connected via the first bump 610.

As described above, a temperature of the chip package may increase due to the heat generated in the chip during the chip package is being driven, thereby deteriorating the driving characteristics of the chip package.

Accordingly, the flexible circuit board for the chip on film according to the embodiment may solve the above problems by effectively dissipating the heat generated from the chip via the hole and the heat dissipation part formed in the substrate 100.

The flexible circuit board for the chip on film according to the embodiment may include the heat dissipation part 400. The heat dissipation part may include a heat dissipation pattern layer 410, a connection layer 420, and a heat dissipation layer 430.

In detail, the heat dissipation part 400 may include the heat dissipation pattern layer 410 disposed on the first surface 1S of the substrate 100, the connection layer 420 disposed inside the hole h formed in the substrate 100, and the heat dissipation layer 430 disposed on the second surface 2S of the substrate 100.

The heat dissipation pattern layer 410, the connection layer 420, and the heat dissipation layer 430 may include the same material. The heat dissipation pattern layer 410, the connection layer 420, and the heat dissipation layer 430 may be integrally formed.

The heat dissipation pattern layer 410, the connection layer 420, and the heat dissipation layer 430 may include the same material as the circuit pattern layer 300. For example, the heat dissipation pattern layer 410, the connection layer 420, and the heat dissipation layer 430 may include a metal material such as copper (Cu).

The heat dissipation pattern layer 410 may be disposed at a position overlapping the chip mounting region 1A of the substrate 100. That is, the heat dissipation pattern layer 410 may be disposed at a position overlapping the hole h formed in the substrate 100.

An area of the heat dissipation pattern layer 410 may be smaller than that of the chip mounting region 1A. In addition, the area of the heat dissipation pattern layer 410 may be smaller than an area of the heat dissipation layer 430.

For example, the area of the heat dissipation pattern layer 410 may be 10% or more with respect to an area of the chip mounting region 1A. In detail, the area of the heat dissipation pattern layer 410 may be 20% or more with respect to the area of the chip mounting region 1A. In more detail, the area of the heat dissipation pattern layer 410 may be 30% or more with respect to the area of the chip mounting region 1A. In more detail, the area of the heat dissipation pattern layer 410 may be 50% or more with respect to the area of the chip mounting region 1A.

When the area of the heat dissipation pattern layer 410 is less than 10% with respect to the area of the chip mounting region 1A, it is difficult to effectively collect heat generated by the chip 500, and thus the heat dissipation characteristics of the heat dissipation part may be deteriorated.

The heat dissipation pattern layer 410 may be connected to the chip 500.

Referring to FIG. 2, a second bump 620 may be disposed between the heat dissipation pattern layer 410 and the chip 500, and the heat dissipation pattern layer 410 and the chip 500 may be connected via the second bump 620.

As the heat dissipation pattern layer 410 and the chip 500 are directly connected via the second bump 620 having high thermal conductivity, the heat generated from the chip 500 may be effectively transferred to the heat dissipation pattern layer 410.

The heat dissipation pattern layer 410 may not be electrically connected to the chip 500, but may only be physically connected thereto. That is, the heat dissipation pattern layer 410 may not be connected to a terminal portion of the chip 500. The heat dissipation pattern layer 410 serves to effectively collect the heat generated by the chip 500 and does not need to be electrically connected to the terminal portion of the chip 500.

Alternatively, the heat dissipation pattern layer 410 may be electrically connected to the chip 500. That is, the heat dissipation pattern layer 410 may be electrically connected to a power source generating the most heat among the terminal portions of the chip 500. In this case, the heat dissipation pattern layer 410 may be connected to the power source among the circuit pattern layers 200. Through this, heat generated from the power source of the chip 500, which generates the most heat among the terminals of the chip 500, may be transferred to the heat dissipation part through the power source of the flexible substrate for the chip on film to efficiently dissipate the heat.

Alternatively, referring to FIG. 3, the heat dissipation pattern layer 410 and the chip 500 may have a separation distance d and may be disposed to be spaced apart from each other.

Through this, the chip 500 may be stably mounted on the flexible substrate for the chip on film due to the second bump 620 formed in the heat dissipation part.

The hole h may be formed in the substrate 100. In detail, at least one hole h may be formed in the chip mounting region 1A of the substrate 100. That is, one or a plurality of holes h may be formed in the chip mounting region 1A of the substrate 100.

The hole h may be disposed on a region overlapping a region where the heat dissipation pattern layer 410 is disposed. In addition, the hole h may be disposed in a region overlapping a region where the heat dissipation layer 430 is disposed. That is, the hole h may be disposed to overlap a region where the heat dissipation pattern layer 410 and the heat dissipation layer 430 overlap.

When the hole overlapping the heat dissipation pattern layer 410 is one, heat of the chip may be transferred well to the heat dissipation pattern layer 410, but efficiency of transferring heat of the heat dissipation pattern layer 410 to the heat dissipation layer 430 is lowered, and thus the overall heat dissipation efficiency may be lowered. Accordingly, in the flexible circuit board for the chip on film according to the embodiment, the holes h overlapping the heat dissipation pattern layer 410 may be formed in plural.

In the heat dissipation pattern layer 410, a length L in a first direction that is a longitudinal direction of the chip 500 may be greater than a width in a second direction that is a width direction of the chip 500. Through this, the heat dissipation efficiency may be improved by widening a region where the chip 500 and the heat dissipation pattern layer 410 overlap.

In the plurality of holes h, a first separation distance d1 spaced apart in the first direction may be smaller than a second separation distance d2 spaced apart in the second direction. The second separation distance d2 may be 1.01 times or more and 5 times or less, 1.02 times or more and 4 times or less, 1.05 times or more and 3 times or less, or 1.1 times or more and 2 times or less of the first separation distance d1. Since the second separation distance d2 is greater than the first separation distance d1, heat generated in a region that does not overlap the chip 500 may be more efficiently dissipated to the heat dissipation layer 430 through the plurality of holes h.

A third separation distance d3, which is a minimum separation distance at which the heat dissipation pattern layer 410 and the circuit pattern layer 200 are spaced apart in the second direction, may be greater than the second separation distance d2 at which the hole h is spaced apart in the second direction. The third separation distance d3 may be 1.01 times or more and 5 times or less, 1.02 times or more and 4 times or less, 1.05 times or more and 3 times or less, or 1.1 times or more and 2 times or less of the second separation distance d2. Since the third separation distance d3 is greater than the second separation distance d2, the heat dissipation pattern layer 410 and the circuit pattern layer 200 are prevented from contacting during a process, thereby improving the reliability of the flexible circuit board.

The circuit pattern layer 200 has a plurality of circuit patterns, and a fourth separation distance d4, which is a minimum separation distance between adjacent circuit patterns among the circuit patterns, may be smaller than the first separation distance d1. The first separation distance d1 may be 2 times or more and 50 times or less, 3 times or more and 30 times or less, 5 times or more and 20 times or less, or 6 times or more and 10 times or less of the fourth separation distance d4. Since the first separation distance d1 is wider than the minimum separation distance between the circuit patterns, it is possible to prevent the holes h from being connected to each other, and accordingly, the connection layer 420 formed inside the holes h may be efficiently formed. When the first separation distance d1 is less than twice the minimum separation distance between the circuit patterns, when the adjacent holes are connected to form the connection layer, the connection layer may not be entirely formed inside the holes, and a disconnection may occur between the heat dissipation pattern layer 410 and the heat dissipation layer 430, so that the heat generated from the chip may not be efficiently transferred to the heat dissipation layer. When the first separation distance exceeds 50 times the minimum separation distance between the circuit patterns, the heat of the chip may be well transferred to the heat dissipation pattern layer 410, but the efficiency of transferring the heat of the heat dissipation pattern layer 410 to the heat dissipation layer 430 is lowered, and thus the overall heat dissipation efficiency may be lowered.

The width w of the heat dissipation pattern layer 410 in the second direction may be greater than a third separation distance d3 that is a circuit separation distance between the circuit pattern and the heat dissipation pattern layer. The width w of the heat dissipation pattern layer 410 may be 1.01 times or more and 10 times or less, 1.05 times or more and 8 times or less, 1.1 times or more and 5 times or less, or 1.5 times or more and 3 times or less of the third separation distance d3. Through this, it is possible to prevent the connection between the heat dissipation pattern layer and the circuit, and the heat dissipation pattern layer may absorb as much heat generated from the chip as possible.

A ratio (length/width) of the length in the first direction to the width in the second direction of the heat dissipation pattern layer may be 0.5 to 5 times or less, 0.8 times to 4 times or less, 1 time to 3 times or less, or 1.2 times to 2.5 times or less of a ratio (length/width) of the length in the first direction to the width in the second direction of the chip. In addition, an area of the heat dissipation pattern layer 410 may be 5% or more, 10% or more, 15% or more, 20% or more, 25% or more, or 30% or more of an area of the chip. In addition, the area of the heat dissipation pattern layer 410 may be 5% or more and 90% or less, 10% or more and 80% or less, 15% or more and 75% or less, 20% or more and 70% or less, 25% or more and 65% or less, or 30% or more and 60% or less of the area of the chip.

That is, since the heat dissipation pattern layer and a lower surface of the chip (a surface on the flexible circuit board side) are most similarly formed, heat collected at an edge of the chip may be absorbed and dissipated at an edge of the heat dissipation pattern layer. In addition, since shapes of the chip and the heat dissipation pattern layer are formed similarly, the heat dissipation pattern layer may efficiently absorb in a plurality of directions the heat generated from the chip.

The connection layer 420 may be disposed inside the hole h. The heat dissipation pattern layer 410 and the heat dissipation layer 430 may be connected via the connection layer 420. For example, after a buffer layer such as palladium (Pd) is disposed on an inner surface of the hole h, the connection layer 420 including a metal such as copper (Cu) may be disposed.

The connection layer 420 may transfer the heat generated from the chip to the heat dissipation layer 430. In order to effectively transfer the heat to the heat dissipation layer 430, the holes h in which the connection layer 420 is disposed may be two or more. In detail, the number of holes h may be ten or more. In more detail, the number of holes h may be fifty or more.

Through this, since the area of the heat dissipation pattern layer 410 may be widened, a large amount of heat generated from the chip 500 may be collected to transfer to the heat dissipation layer 430 via the connection layer formed in the plurality of holes h, thereby efficiently transferring the heat of the chip 500 to the outside.

The heat dissipation layer 430 may be disposed on the second surface 2S of the substrate 100. The heat dissipation layer 430 may be disposed on a region corresponding to the chip mounting region 1A of the substrate 100.

The area of the heat dissipation layer 430 may be larger than that area of the heat dissipation pad layer 410. The area of the heat dissipation layer 430 may be an area corresponding to the area of the chip mounting region 1A. Accordingly, heat collected by the heat dissipation pad layer 410 and transferred via the connection layer 420 may be effectively dissipated to the outside via the heat dissipation layer 430.

The heat dissipation layer 430 may be disposed to have a thickness of 5 µm to 25 µm. For example, the heat dissipation layer 430 may have a thickness of 10 µm to 20 µm. For example, the heat dissipation layer 430 may have a thickness of 13 µm to 17 µm.

When the thickness of the heat dissipation layer 430 is less than 5 µm, the heat generated from the chip may not be effectively dissipated to the outside, and thus the heat dissipation characteristics of the chip package may be deteriorated. In addition, when the thickness of the heat dissipation layer 430 exceeds 25 µm, the overall thickness of the chip package may be increased by the thickness of the heat dissipation layer 430.

Meanwhile, although not shown in the drawings, a protective layer may be additionally disposed under the heat dissipation layer 430. Accordingly, oxidation and damage to the heat dissipation layer 430 may be prevented, thereby improving heat dissipation characteristics and reliability of the chip package.

The flexible substrate for the chip on film according to the embodiment may effectively dissipate the heat generated in the chip to the outside via the hole formed in the substrate and the heat dissipation part disposed on the first surface, on the second surface, and inside the hole of the substrate.

That is, the heat generated from the chip may be collected via the heat dissipation pattern layer, and the heat may be transferred to the heat dissipation layer via connection portions disposed in the plurality of holes to dissipate the heat to the outside.

In addition, the heat may be effectively transferred to the heat dissipation layer by forming the hole to which the heat is transferred in plural, and the heat dissipation layer is formed to have an area corresponding to the chip mounting region, thereby easily dissipating the heat generated from the chip to the outside.

Accordingly, since the flexible substrate for the chip on film and the chip package including the same according to the embodiment have improved heat dissipation characteristics, reliability and driving characteristics of the chip package may be improved.

Hereinafter, a flexible substrate for a chip on film and a chip package including the same according to another embodiment will be described with reference to FIGS. 4 to 6.

In the description of the flexible substrate for the chip on film and the chip package including the same according to another embodiment, the same description as the flexible substrate for the chip on film and the chip package including the same according to the embodiment described above will be omitted, and the same reference numerals are assigned to the components.

Referring to 4 to 6, the flexible substrate for the chip on film and the chip package including the same according to another embodiment may include a plurality of heat dissipation pattern layers. In detail, a first heat dissipation pattern layer 401 and a second heat dissipation pattern layer 402 may be included on the substrate 100.

Two heat dissipation pattern layers are shown in FIGS. 4 to 6, but the embodiment is not limited thereto and three or more heat dissipation pattern layers may be included.

The first heat dissipation pattern layer 401 and the second heat dissipation pattern layer 402 may be disposed to be spaced apart from each other.

An area of the first heat dissipation pattern layer 401 and the second heat dissipation pattern layer 402 may be smaller than that of the chip mounting region 1A. In addition, the area of the first heat dissipation pattern layer 401 and the second heat dissipation pattern layer 402 may be smaller than that of the heat dissipation layer 430.

At least one of the first heat dissipation pattern layer 401 and the second heat dissipation pattern layer 402 may be electrically connected to the chip 500.

Referring to FIG. 5, the second bump 620 is disposed between at least one of the first heat dissipation pattern layer 401 and the second heat dissipation pattern layer 402 and the chip 500, and the heat dissipation pattern layer 410 and the chip 500 may be electrically connected via the second bump 620.

FIG. 5 illustrates that both the first heat dissipation pattern layer 401 and the second heat dissipation pattern layer 402 are connected to the chip 500 via the second bump 620, but the embodiment is not limited thereto. At least one of the first heat dissipation pattern layer 401 and the second heat dissipation pattern layer 402 may not be electrically connected to the chip 500 and may be spaced apart from each other or physically connected to the chip 500. That is, a terminal portion of the chip and the second bump may not be connected.

The first heat dissipation pattern layer 401 and the second heat dissipation pattern layer 402 may be connected to the heat dissipation layer 430 disposed on the second surface 2S of the first substrate 100 via the connection part 420.

That is, the first heat dissipation pattern layer 401 and the second heat dissipation pattern layer 402 may be connected to the same heat dissipation layer 430 disposed on the second surface 2S of the first substrate 100 via the connection part 420.

The flexible substrate for the chip on film and the chip package including the same according to another embodiment may include the plurality of heat dissipation pattern layers.

Accordingly, even when one of the heat dissipation pattern layers is damaged, the heat dissipation part 400 may maintain the heat dissipation characteristic, thereby increasing the lifespan of the heat dissipation characteristic.

Hereinafter, a flexible substrate for a chip on film and a chip package including the same according to still another embodiment will be described with reference to FIGS. 7 and 8.

In the description of the flexible substrate for the chip on film and the chip package including the same according to still another embodiment, description the same as or similar to the description of the flexible substrate for the chip on film and the chip package including the same according to the embodiment described above will be omitted, and the same reference numerals are assigned to the same components.

Referring to FIGS. 7 and 8, the flexible substrate for the chip on film and the chip package including the same according to still another embodiment may further include an extension pattern layer 210. In detail, the extension pattern layer 210 connecting the circuit pattern layer 200 and the heat dissipation pattern layer 410 may be disposed on the first surface 1S of the substrate 100.

The extension pattern layer 210 may be a pattern layer extending from the circuit pattern layer 200. The extension pattern layer 210 may be disposed in contact with the circuit pattern layer 200 and the heat dissipation pattern layer 410.

FIG. 7 illustrates that the number of the extension pattern layers 210 is two, but the embodiment is not limited thereto, and the number of the extension pattern layers 210 may be one or three or more.

In the flexible substrate for the chip on film and the chip package including the same according to still another embodiment, the second bump connecting the heat dissipation pattern layer and the chip may not be disposed by the extension pattern layer. That is, since the heat dissipation pattern layer and the chip are connected via the circuit pattern layer and the connection pattern layer, heat generated from the chip may be effectively transferred to the heat dissipation pattern layer without the second bump.

In the above embodiment, it is illustrated that the chip and the flexible substrate for the chip on film are electrically connected using bumps, but the embodiment is not limited thereto, and the chip may be wire-bonded through a wire. In this case, in the circuit pattern layer 200 on which the protective layer 300 is not disposed, a plating layer including tin may be disposed on the circuit pattern layer 200 in order to facilitate the wire bonding. For example, the plating layer may include a first tin plating layer having a low tin content and a second tin plating layer disposed on the first tin plating layer and including pure tin having a high tin content. Accordingly, the wire bonding to the circuit pattern layer 200 may be facilitated.

In this case, the chip and the circuit pattern of the flexible substrate for the chip on film are connected through a wire, but the chip and the heat dissipation pattern layer may be physically or electrically connected via a bump.

Hereinafter, an example of various electronic devices including a flexible circuit board for a chip on film according to an embodiment will be described with reference to FIGS. 9 to 15.

Referring to FIG. 9, the flexible circuit board for the chip on film according to the embodiment may be used for an edge display.

In addition, referring to FIG. 10, the flexible circuit board for the chip on film according to the embodiment may be included in a fordable flexible electronic device. Therefore, the touch device including the same may be a flexible touch device. And thus, a user may fold or bend by hand. Such a flexible touch window may be applied to a wearable touch device or the like.

In addition, referring to FIGS. 11 to 13, the flexible circuit board for the chip on film according to the embodiment may be applied to various electronic devices to which a foldable display device is applied. Referring also to FIGS. 11 to 13, the foldable display device may fold a foldable cover window. The foldable display device may be included in various portable electronic products. Specifically, the foldable display device may be included in a mobile terminal (mobile phone), a notebook (portable computer), and the like. Accordingly, while increasing the display region of a portable electronic product, a size of the device may be reduced during storage and transportation, and thus portability may be improved. Therefore, convenience of a user of the portable electronic product may be improved. However, the embodiment is not limited thereto, and of course, the foldable display device may be used for various electronic products.

In addition, referring to FIG. 14, the flexible circuit board for the chip on film according to the embodiment may be included in various wearable touch devices including a curved display. Therefore, an electronic device including the flexible circuit board for all-in-one chip on film according to the embodiment may be reduced in thickness, size and weight.

In addition, referring to FIG. 15, the flexible circuit board for the chip on film according to the embodiment may be used for various electronic devices having a display portion such as a TV, a monitor, and a laptop computer.

However, the embodiment is not limited thereto, and of course, the flexible circuit board for the chip on film according to the embodiment may be used for various electronic devices having a flat plate or a curved-shaped display portion.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

What is claimed is:

1. A flexible circuit board for a chip on film, the flexible circuit board comprising:
    a substrate including a first surface and a second surface opposite to the first surface, and the substrate including a chip mounting region;
    a circuit pattern layer disposed on the first surface; and
    a heat dissipation part disposed on the chip mounting region,
    wherein the substrate is formed with at least two or more holes that are provided in a region overlapping the heat dissipation part, and
    the heat dissipation part includes:
        a heat dissipation pattern layer disposed on the first surface;
        a connection layer disposed inside the hole; and
        a heat dissipation layer disposed on the second surface,
    wherein a first direction corresponds to a longitudinal direction of a chip disposed on the chip mounting region, and a second direction corresponds to a width direction of the chip disposed on the chip mounting region,
    wherein a first separation distance is a spaced apart distance in the first direction of two of the holes, a second separation distance is a spaced apart distance in the second direction of two of the holes, and the first separation distance is smaller than the second separation distance,
    wherein a third separation distance is a minimum separation distance in the second direction of the heat dissipation pattern layer and the circuit pattern layer, and the third separation distance is greater than the second separation distance,
    wherein the circuit pattern layer has a plurality of circuit patterns,
    wherein a fourth separation distance is a minimum separation distance between two adjacent circuit patterns of the plurality of circuit patterns, and the fourth separation distance is smaller than the first separation distance.

2. The flexible circuit board of claim 1, wherein the heat dissipation pattern layer, the connection layer, and the heat dissipation layer are integrally formed.

3. The flexible circuit board of claim 1, wherein an area of the heat dissipation pattern layer is smaller than an area of the heat dissipation layer.

4. The flexible circuit board of claim 1, wherein an area of the heat dissipation pattern layer is 5% or more than an area of the chip.

5. The flexible circuit board of claim 1, wherein the heat dissipation pattern layer includes a first heat dissipation pattern layer, and a second heat dissipation pattern layer spaced apart from the first heat dissipation pattern layer, and
    the first heat dissipation pattern layer and the second heat dissipation pattern layer are connected to the same heat dissipation layer.

6. The flexible circuit board of claim 5, wherein the first heat dissipation pattern layer is connected to at least two or more of the connection layers.

7. The flexible circuit board of claim 1, further comprising a connection pattern layer that connects the circuit pattern layer and the heat dissipation pattern layer.

8. The flexible circuit board of claim 1, wherein the circuit pattern layer includes a first metal layer and a second metal layer on the first metal layer, and
    a thickness of the first metal layer is smaller than a thickness of the second metal layer.

9. The flexible circuit board of claim 1, wherein a thickness of the substrate is 5 μm to 100 μm.

10. The flexible circuit board of claim 1, wherein a thickness of the circuit pattern layer is 5 μm to 25 μm.

11. The flexible circuit board of claim 1, wherein an area of the heat dissipation pattern layer is 10% or more than an area of the chip mounting region.

12. The flexible circuit board of claim 1, wherein a length in the first direction of the heat dissipation pattern layer is greater than a width in the second direction of the heat dissipation pattern layer.

13. The flexible circuit board of claim 1, wherein a ratio of the length in the first direction of the heat dissipation pattern layer to the width in the second direction of the heat dissipation pattern layer is 0.5 to 5 times a ratio of a length in the first direction of the chip to a width in the second direction of the chip.

14. A chip package comprising:
    a substrate including a first surface and a second surface opposite to the first surface and the substrate including a chip mounting region;
    a circuit pattern layer disposed on the first surface;
    a chip electrically connected to the circuit pattern layer; and
    a heat dissipation part disposed on the chip mounting region,
    wherein the substrate is formed with at least two or more holes that are provided in a region overlapping the heat dissipation part, and
    the heat dissipation part includes:
        a heat dissipation pattern layer disposed on the first surface;
        a connection layer disposed inside the hole; and
        a heat dissipation layer disposed on the second surface,
    wherein the heat dissipation pattern layer, the connection layer, and the heat dissipation layer are integrally formed,
    wherein a first direction corresponds to a longitudinal direction of a chip disposed on the chip mounting region, and a second direction corresponds to a width direction of the chip disposed on the chip mounting region,
    wherein a first separation distance is a spaced apart distance in the first direction of two of the holes, a second separation distance is a spaced apart distance in the second direction of two of the holes, and the first separation distance is smaller than the second separation distance, wherein a third separation distance is a minimum separation distance in the second direction of the heat dissipation pattern layer and the circuit pattern layer, and the third separation distance is greater than the second separation distance, wherein the circuit pattern layer has a plurality of circuit patterns, wherein a fourth separation distance is a minimum separation distance between two adjacent circuit patterns of the plurality of circuit patterns, and the fourth separation distance is smaller than the first separation distance.

15. The chip package of claim 14, wherein the heat dissipation pattern layer and the chip are spaced apart from each other.

16. The chip package of claim 14, wherein the heat dissipation pattern layer and the chip are connected via bumps.

* * * * *